United States Patent [19]
Luber

[11] Patent Number: 5,487,013
[45] Date of Patent: Jan. 23, 1996

[54] SYSTEM AND METHOD FOR READING OPERATING PARAMETERS INTO AN OPERATIONALLY READY PROXIMITY SWITCH

[75] Inventor: Ernst Luber, Neukirchen, Germany

[73] Assignee: Siemens Aktiengesellschaft, München, Germany

[21] Appl. No.: 402,756

[22] Filed: Mar. 10, 1995

Related U.S. Application Data

[63] Continuation of Ser. No. 893,436, Jun. 4, 1992, abandoned.

[30] Foreign Application Priority Data

Jun. 13, 1991 [EP] European Pat. Off. ............. 91109720

[51] Int. Cl.⁶ ........................ G08B 21/00; H03K 17/945
[52] U.S. Cl. ...................... 364/480; 307/125; 361/179; 361/87; 340/644
[58] Field of Search ...................... 364/480, 481, 364/483, 464.04; 340/870.02, 870.28, 644, 870.14, 870.24, 825.14, 825.2; 324/207.16; 307/269, 116, 125; 367/93; 361/98, 179, 187, 93, 87

[56] References Cited

U.S. PATENT DOCUMENTS

| | | | |
|---|---|---|---|
| 4,291,375 | 9/1981 | Wolf | 364/464.04 |
| 4,511,979 | 4/1985 | Amirante | 364/481 |
| 4,542,469 | 9/1985 | Branyberry et al. | 340/870.28 |
| 4,621,330 | 11/1986 | Weikel | 364/DIG. 2 |
| 4,649,527 | 3/1987 | Forster et al. | 367/108 |
| 4,713,602 | 12/1987 | Ueda | 323/354 |
| 4,803,632 | 2/1989 | Frew et al. | 340/870.02 |
| 4,916,613 | 4/1990 | Lange et al. | 364/400 |
| 5,153,837 | 10/1992 | Shaffer et al. | 364/464.04 |

FOREIGN PATENT DOCUMENTS

| | | |
|---|---|---|
| 0313162 | 4/1989 | European Pat. Off. |
| 2600845 | 12/1987 | France |
| 3608639 | 9/1986 | Germany |
| 2194108 | 2/1988 | United Kingdom |

OTHER PUBLICATIONS

Messen, Prüfen, Automatisieren, vol. 118, No. 10, Oct. 1988, Bad Wörishofen, W. Germany, Schwager: *Störschutz und Kurzschlussüberwachung für Induktive Näherungsschalter*, pp. 509–511. No translation.

*Primary Examiner*—Emanuel T. Voeltz
*Assistant Examiner*—M. Kemper
*Attorney, Agent, or Firm*—Kenyon & Kenyon

[57] ABSTRACT

The operating parameters of a proximity switch can differ depending on the type of switch and also because of manufacturing tolerances. To make it possible for one to react to new developments in ultrasonic transducers and to customer-specific solutions without requiring additional space, data such as operating parameters are able to be input into a microprocessor of a prefabricated proximity switch with little expenditure of time and energy. A proximity switch may contain an enabling input and an overcurrent-detection device including a microprocessor. An overcurrent across the switching output can be identified by a pulse provided to a first input of the microprocessor. A programming device is provided through which such an overcurrent condition is simulated and the corresponding pulse is generated which represents information about an operating parameter in the form of a bit pattern. The microprocessor is loaded with this bit pattern. The enabling input is used to synchronize the microprocessor using first synchronizing pulses.

21 Claims, 4 Drawing Sheets

SYSTEM AND METHOD FOR READING OPERATING PARAMETERS INTO AN OPERATIONALLY READY PROXIMITY SWITCH

This application is a continuation of application Ser. No. 07/893,436, filed on Jun. 4, 1992, now abandoned.

BACKGROUND OF THE INVENTION

The operating parameters for operating a proximity switch can differ depending on the type of switch and also because of manufacturing tolerances. Up until now, for example, many parameters have determined the echo-time evaluation of an ultrasonic proximity switch in a mask-programmed microprocessor. To enable manufacturing tolerances to be compensated for in electronic components and ultrasonic transducers, it is advantageous to retain the operating parameters as variable operating parameters until the ultrasonic proximity switch is used. Moreover, such a flexible operation makes it possible for one to react to new developments in ultrasonic transducers and to customer-specific solutions for an ultrasonic proximity switch.

Up until now, to solve this problem, the operating parameters were stored in the program memory of a mask-programmed microprocessor. For this purpose, solutions entailing pull-up resistors on the microprocessor were applied. In this case, however, the disadvantage arose that one was only able to react to new developments in the ultrasonic transducer and to customer-specific design approach solutions with a relatively high expenditure of time and energy for circuit engineering.

To adjust operating parameters in ultrasonic sensors, it is furthermore known (see the prospectus *Ultrasonic Sensors*, International Edition '91 by Pepperl & Fuchs) to use encoding switches in the clamping space, whereby the encoding switch is used to switch over from the switching output to the serial interface. This means that from a standpoint of circuit engineering, time and energy must be expended for the short-circuit-proof switching output and for the required voltage level for the serial interface. However, this solution requires additional expenditure for circuit wiring. Furthermore, it is disadvantageous that space is needed, which leads to problems, for example, in applications using compact proximity switches.

SUMMARY OF THE INVENTION

Therefore, the present invention relates to a system and a method which, without entailing additional space requirements, enable data to be input inexpensively. Specifically, operating parameters may be input into a microprocessor of a prefabricated proximity switch that has an enabling input. A proximity switch is provided which, in addition to the enabling input, contains an overcurrent-detection device with a microprocessor. An overcurrent across the switching output can be signalled to the microprocessor by a pulse provided at a corresponding first input thereof. A programming device is provided through which such an overcurrent condition is simulated and a corresponding pulse is generated. This pulse represents information about an operating parameter in the form of a bit pattern with which the microprocessor is loaded. The enabling input is used to synchronize the microprocessor using first synchronizing pulses.

In a specific embodiment, the programming device switches a connection between two terminals of a load (e.g. an ohmic resistor) to low resistance. The advantage of this embodiment is that the connecting terminals for the load are available anyway. In other words, no additional terminals are necessary and these terminals can be accessed externally of the proximity switch.

Moreover, it is expedient for the overcurrent-detection device to include a current-sensing resistor, by means of which a voltage drop due to an excess current is produced. This voltage drop triggers a first transistor, which in turn switches through a potential of a first voltage source as a pulse to the first input of the microprocessor. This specific embodiment for monitoring excess current can also be applied in an unchanged form for programming operating parameters in the microprocessor. Furthermore, it is advantageous for the proximity switch to be a three-wire compact switch with a four-pole plug-in connection, since the above-mentioned solution is successful using the enabling input as a connecting terminal and, in addition, does not require additional space, so that its application is particularly suited for compact proximity switches. When a user-programmable memory E2 PROM (ROM) is provided for filing the parameters, the stored parameters are also able to be retained after the operating voltage is cut off. The above-mentioned device is particularly suited for application with ultrasonic proximity switches, since in this case many parameters are required for operation, which often are only established shortly before actually being used by the customer.

If a synchronizing device is wired between the enabling input and the microprocessor, the above-mentioned advantages are combined with the advantages of a synchronizing device which permits parallel and serial synchronization in the case of an ultrasonic proximity switch. In another advantageous embodiment of the present invention, the triggering takes place with time coding, which results in an insensitivity to pulse spikes. The ultrasonic transducer type is inferred from the synchronizing pulse lengths. Thus, the operating parameters can be checked for their validity. In addition, because of the time-coded triggering, the read-out mode is possible.

BRIEF DESCRIPTION OF THE DRAWINGS

Other features and advantages of the present invention will become apparent in view of the following description taken in conjunction with the accompanying drawings, wherein.

DETAILED DESCRIPTION

Figure 1:
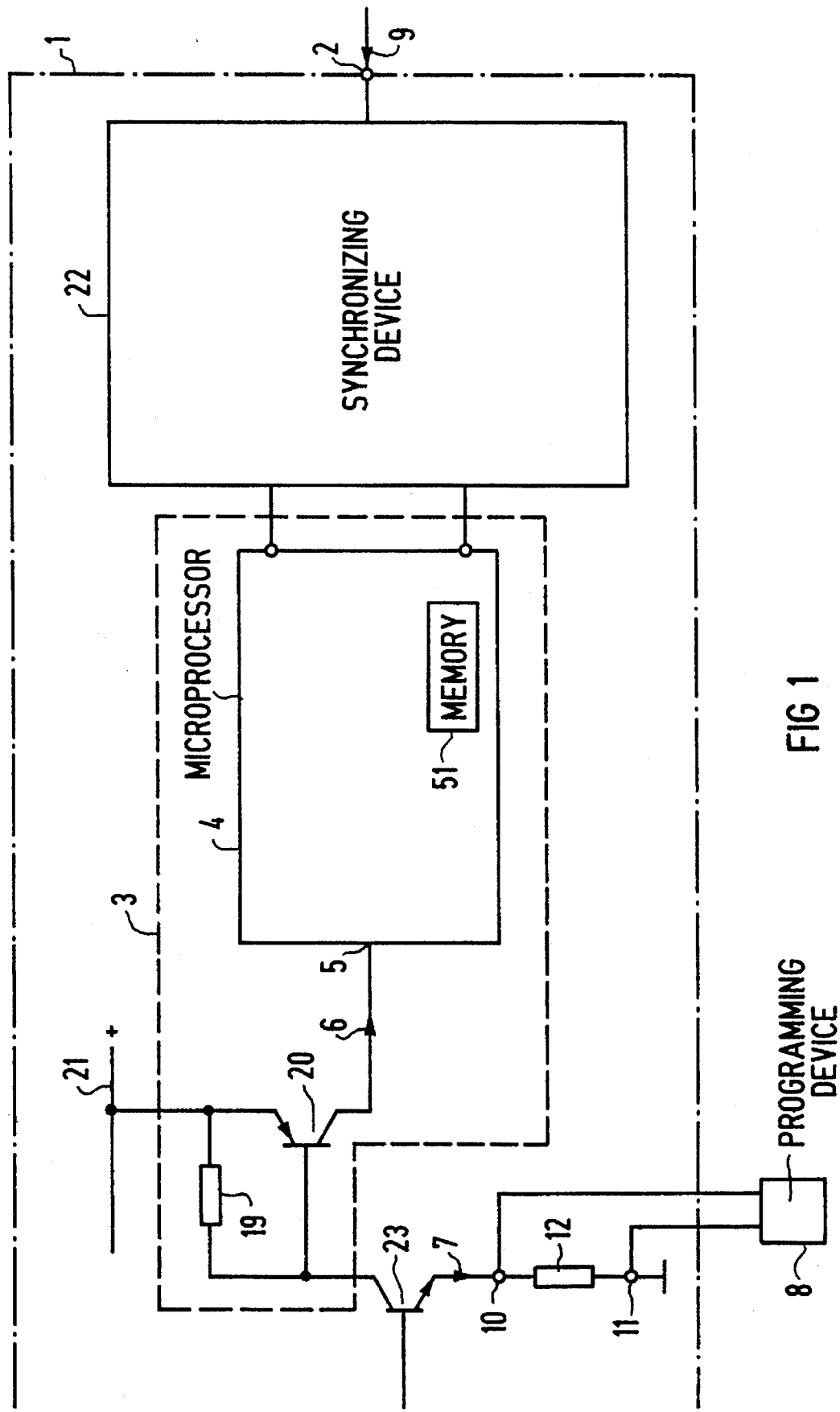
FIG. 1 illustrates a cut-away portion of a proximity switch including an overcurrent-detection device.

FIG. 1 depicts an overcurrent-detection device 3 for a proximity switch 1 comprising a current-sensing resistor 19, a first transistor 20 and a microprocessor 4. The overcurrent-detection device 3 is supplied by a first voltage source with a voltage potential 21 and is switched by means of an additional transistor 23 serving as a switching output of the proximity switch 1 to a load realized in the embodiment of FIG. 1 as an ohmic resistor 12. To connect up the load 12, two connecting terminals 10, 11 are provided which can be accessed externally from the proximity switch 1. When a programming device 8 switches the load 12 to low resistance, the result is an excess current 7. This excess current 7 flows through the current-sensing resistor 19 and the switching output transistor 23 and produces an increased voltage drop across the current-sensing resistor 19. This voltage drop triggers the transistor 20 and causes the voltage potential 21 to be switched through to an input 5 of the microprocessor 4 and a corresponding pulse 6 is generated at the input 5. This protective device, which actually can be provided for excess current, is drawn upon according to the present invention for the data input of operating parameters. For this purpose, a short circuit is simulated between the connecting terminals 10 and 11 with the help of programming device 8. For the duration of the programming, the additional transistor 23 used as the switching output of the proximity switch is switched through. To synchronize the pulses 6 at the first input 5 of the microprocessor 4, first synchronizing pulses 9 are supplied to the proximity switch 1 through its enabling input 2. The operating parameters may be stored in a memory 51 of the microprocessor 4.

Figure 2:
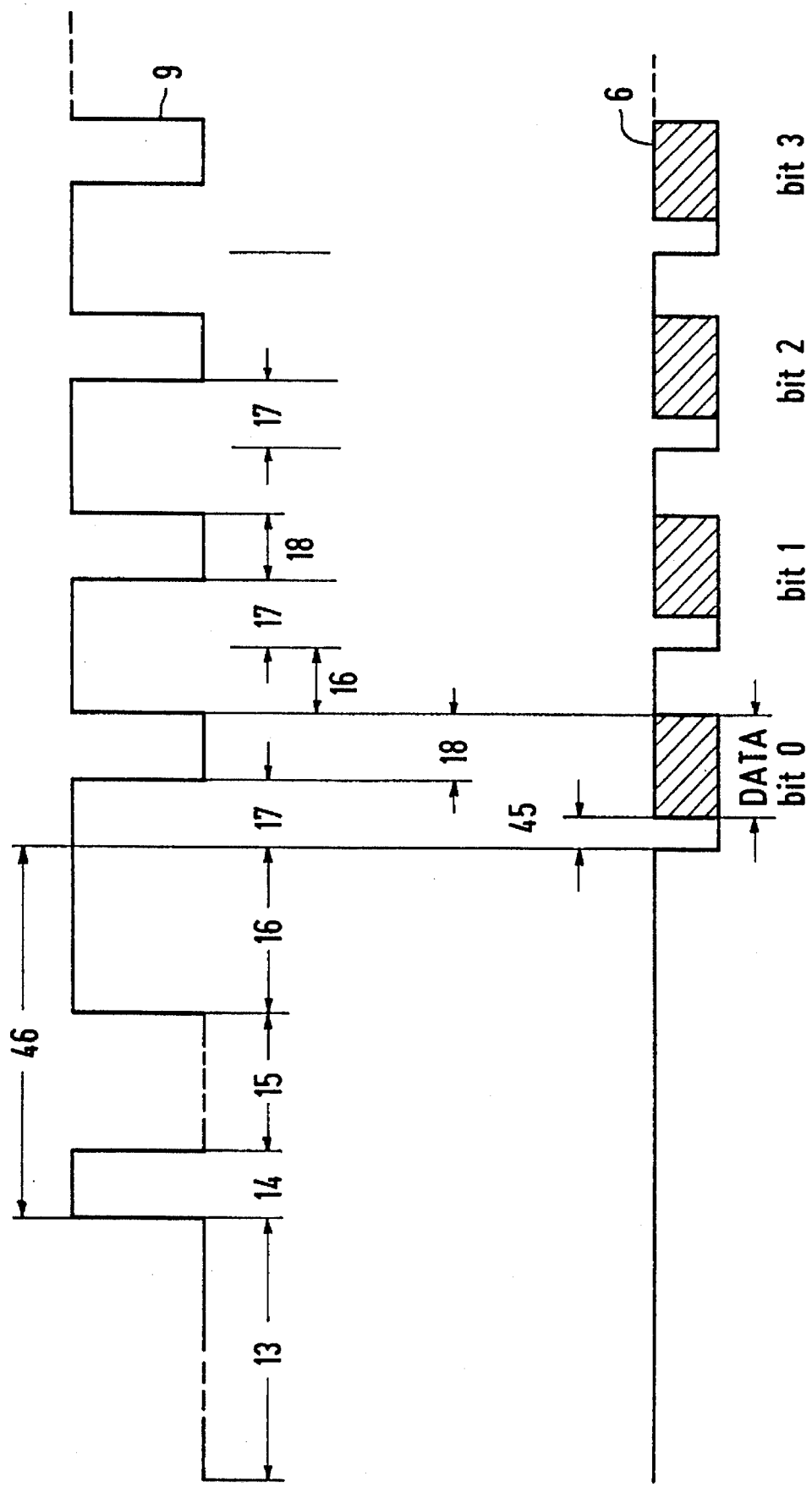
FIG. 2 illustrates a bit pattern for the serial data input of operating parameters.

The configuration of the synchronizing pulses 9 and their allocation to the bit pattern for the data bits of the operating parameters, which are generated in the form of pulses 6 by the programming device 8, can be inferred from FIG. 2. The purpose of the pulse grid is to recognize program cycles and read-out cycles.

In the operational case, the enabling input 2 is used for synchronizing and for the external enabling control of an ultrasonic, compact proximity switch. The switching output can be loaded up to 300 mA and is short-circuit and overload proof. Operating parameters and measured values can be read in and out as special functions through the connecting terminals 10, 11. These special functions are initiated by a coded timing window 46 illustrated in FIG 2. During the read-in operation, that is during programming, an excess-current pulse 45 must be generated by the programming device 8 at the switching output transistor 23 in accordance with the coded timing window 46 of the pulse 9 at the enabling input 2.

The advantage of this addressing lies in the capability for linking to the enable control. This can be realized without expending a great deal of programming effort in the microprocessor 4, which has a limited program memory. Interference analyses have shown that, as a result of this temporal encoding, no read-in or read-out operations are initiated unintentionally. The type of ultrasonic transducer used in the proximity switch in question is inferred from the synchronizing pulse duration 13. As a result, one can check the operating parameters that are valid for this type of transducer.

Figure 5:
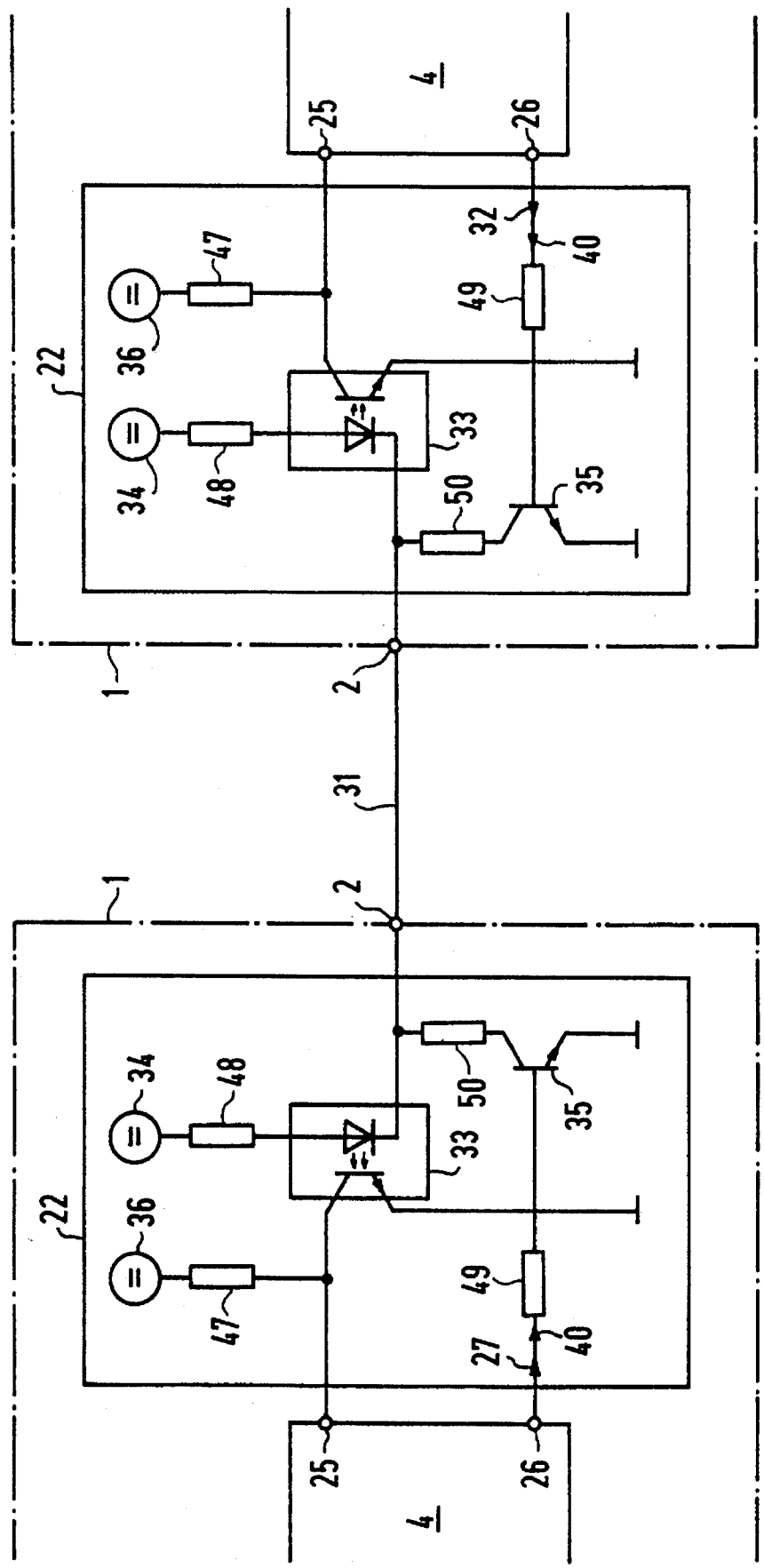
FIG. 5 illustrates two proximity switches connected by a shared line at their enabling inputs.

The time-coded triggering with the synchronizing pulses 9 takes place, for example, through the enable-synchronizing line 31 illustrated in FIG. 5. The synchronizing pulse 9 is thereby composed of the following time durations illustrated in FIG. 2:

| | |
|---|---|
| Synchronizing duration 13: | The programming device 8 is synchronized with the ultrasonic, compact proximity switch, and the coded timing window 46 is output with the rising edge of the synchronizing pulse 9. |
| Delay 14, Programming-enable time 15, Delay 16: | Programming operation during coded timing window 46 for read-out operation. |
| Data bit acceptance 17: | Time until falling edge, which initiates data bit acceptance. |
| Data bit acknowledgement 18: | Time until rising edge, which acknowledges data bit acceptance. |
| Switching output: | |
| Data bit enable time 45: | During this time, a defined excess current is simulated by the programming device 8 and, in this manner, a data bit acceptance is initiated. |

The described method for loading operating parameters into the microprocessor 4 of a proximity switch is also applicable in the case of an ultrasonic proximity switch 1 by way of its enabling input 2 in the specific embodiment described in the following, in which a synchronizing device 22 is interconnected between the enabling input 2 and the microprocessor 4. Here, in addition, parallel and serial synchronization are capable of being carried out by way of the same enabling input 2.

Therefore, this solution is advantageous for proximity switches which usually have few connecting terminals, such as for three-wire compact switches with a four-pole plug-in connection.

Figure 3:
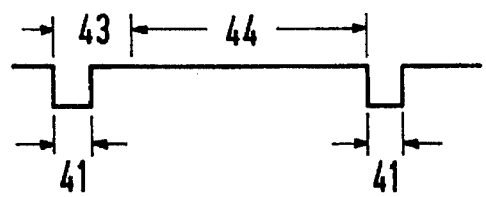
FIG. 3 illustrates a measuring cycle of an ultrasonic proximity switch.

FIG. 3 depicts a measuring cycle of a proximity switch, which begins with the output of an initial transmit pulse 41 of about 150 μs duration and which encompasses a detecting range 43 of, for example, 4.7 ms, which is followed by an evaluation duration 44. This evaluation duration 44 varies in length in dependence upon the type of unit and fluctuates within a range of, for example, 10 to 14 ms. The result of this fluctuation range is that even after a parallel synchronization, that is after the initial pulses are mutually transmitted by adjoining ultrasonic proximity switches, the measuring cycle is not ended for all of the ultrasonic proximity switches at the same time. Consequently, one must first wait until each ultrasonic proximity switch is ready to start a new measuring cycle. For this purpose, after the evaluation duration 44 ends, each ultrasonic proximity switch generates its own second synchronizing pulse 27 or 32, whereby the length of the synchronizing pulse 27 or 32 is selected so that, in any case, at least two synchronizing pulses 27 or 32 partially overlap temporally.

Figure 4:
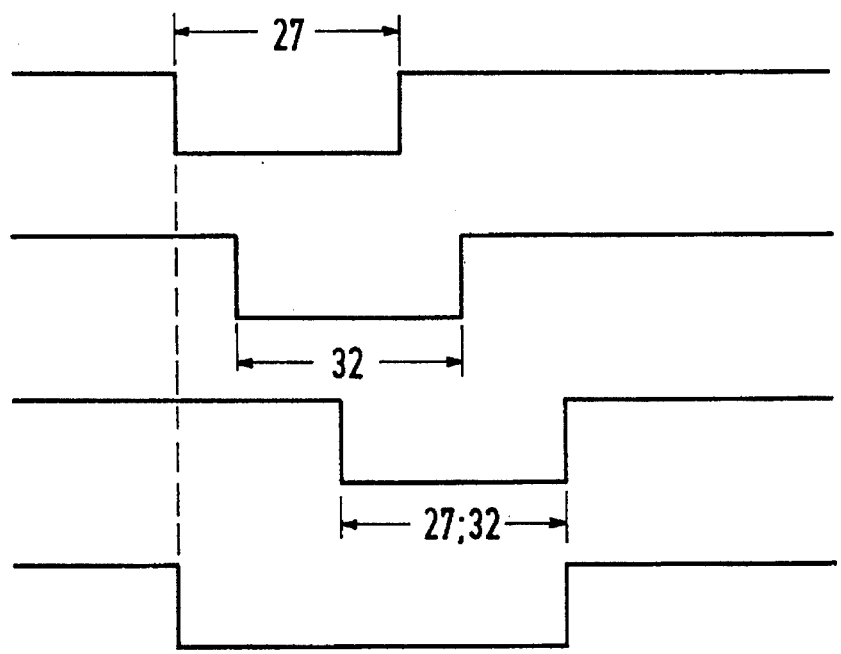
[FIG. 4 illustrates a synchronizing-pulse grid for operating adjoining ultrasonic proximity switches.

FIG. 4 depicts, as an example, such a grid with synchronizing pulses 27 or 32 from three proximity switches. The synchronizing pulse 27 or 32 is generated in the microprocessor 4 of the ultrasonic proximity switch 1 (see FIG. 5). Ultrasonic proximity switches 1, which are operated adjacent to one another, are interconnected by way of their enabling input 2 using a shared line 31. A synchronizing device 22 is situated between the microprocessor 4 and the enabling input 2 of each proximity switch 1. At its output 26, the microprocessor 4 emits the synchronizing pulse 27 or 32 to the synchronizing device 22, which, as a result, produces a change in voltage potential in the shared line 31, which at the same time gives rise to a corresponding feedback signal to a second input 25 of the microprocessor 4 in the ultrasonic proximity switch 1. This means that the potential status on the shared line 31 remains as long as a second synchronizing pulse 27 or 32 is still applied from at least one proximity switch 1. This is expressed by the total signal, depicted at the bottom of FIG which follows from all second synchronizing pulses 27 or 32. The information that all ultrasonic proximity switches 1 on the shared line 31 are not yet ready for operation is thus supplied through the mentioned feedback of the potential state of the shared line 31 to the second input 25 from the microprocessor 4 of each ultrasonic proximity switch 1. Only after the last, second synchronizing pulse 27 or 32 is run off in the synchronizing-pulse grid, does the shared line 31 go over to another potential state and, as a result, indicate to the second input 25 of the microprocessor 4 that all ultrasonic proximity switches 1 are clear to send. This last change in potential is used to introduce the initial pulses 41 when parallel synchronization is used.

Two ultrasonic proximity switches 1, which are interconnected by way of their enabling input 2 through a shared line 31, are depicted in FIG. 5. In each ultrasonic proximity switch 1, there is a microprocessor 4 with a second input 25 and an output 26. A synchronizing device 22 with the following configuration is situated between terminals 25, 26 and the enabling input 2. A second transistor 35 is connected between the enabling input 2 and the frame potential of the synchronizing device 22. Second transistor 35 is able to be triggered via the output 26 of the microprocessor 4 via an ohmic resistor 49 and is fed through a second voltage source 34 via an ohmic resistor 50, an optocoupler 33 and an ohmic resistor 48. The contact-break distance of the optocoupler 33 is connected, on the one hand, to the second input 25 of the micro-processor 4 and via an ohmic resistor 47 to a third voltage source 36, as well as, on the other hand, to the frame potential. By feeding a synchronizing pulse 27 or 32 generated in the microprocessor 4 to the output 26, second transistor 35 is switched through and, consequently, the line 31 connected to the enabling input 2 is connected to frame potential. At the same time second transistor 35 is switched through, the optocoupler 33 is connected through and, as a result, the second input 25 of the microprocessor 4 is likewise connected to frame potential. The synchronizing pulses 27 or 32 of the interconnected ultrasonic proximity switches 1 overlap temporally at least in part, so that frame potential is applied to the second inputs 25 of the microprocessors 4 of all interconnected ultrasonic proximity switches 1 for as long as this is also the case for the shared line 31, that is, for as long as any second synchronizing pulse 27 or 32 is applied. The duration is represented in FIG. 4 by the lower total pulse formed from the three top synchronizing pulses. Only after the temporally last occurring, second synchronizing pulse 27 has run off, is the shared line 31 connected to a high potential made available by the second voltage source 34 and, consequently, at the same time, a high potential, which corresponds to the third voltage source 36, is also produced at every second input 25 of the microprocessors 4. As a result of this last change in potential at the second input 25, the information is given that all ultrasonic proximity switches 1 are ready to transmit and that the initial pulse 41 (see FIG. 3) can now be emitted at the same instant.

Figure 6:
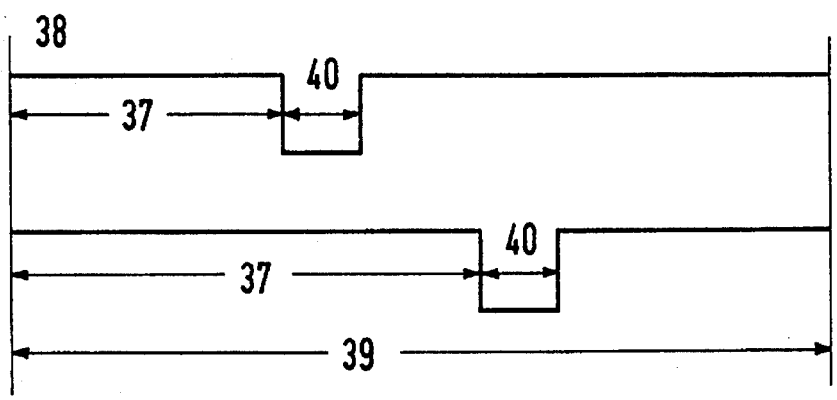
FIG. 6 illustrates a pulse diagram for establishing priorities in the case of serial synchronization.

If one is confronted with the problem of detecting objects at varying distances using adjacent ultrasonic proximity switches 1, then the operation should be undertaken with serial synchronization. In this case, the measuring cycle of one proximity switch 1 is taken over by a further measuring cycle of another adjacent ultrasonic proximity switch 1, so that in each case one measurement is always made with only one single ultrasonic proximity switch 1. The ultrasonic proximity switches 1 that are used have the same configuration as that described for parallel synchronization. Additionally, in the case of serial synchronization it must initially be determined if all the ultrasonic proximity switches 1 connected up to a shared line are ready for operation. For this purpose, as in the case of the parallel synchronization, initially a synchronizing-pulse grid according to FIG. 4 runs off, whereby now, however, the state change at the end of the bottom total pulse to high potential, both the shared line 31 as well as across the second input 25 of the microprocessors 4, is used as a starting point 38 (see FIG. 6). Each ultrasonic proximity switch 1 receives an address in the form of a time segment 37, which is stored in the microprocessor 4 and serves, so to speak, as an identifier of the particular ultrasonic proximity switch 1. Starting from the mutual starting point 38, these time segments 37 are started according to the pulse diagram of FIG. 6. At the end of each time segment 37, whose length is typical for the specific ultrasonic proximity switch 1, a short priority pulse 40 is emitted. The addresses, that is the time segments 37 and the duration of the priority pulses 40, are selected in such a way that the priority pulses 40 do not overlap temporally. A timing window 39, which is selected to be large enough and in which are found in any case the priority pulses 40 from all adjacent ultrasonic proximity switches 1, begins to run at the starting point 38. As previously explained with respect to parallel synchronization operation, these priority pulses 40 are generated in the microprocessor 4 and are supplied by output 26 to the synchronizing device 22 and, for the duration of the priority pulse 40, a change in voltage potential is produced leading to ground on the shared line 31. Also associated with this, in accordance with the description of the synchronizing pulses 27, 32, is a change in voltage potential at the second input 25 of the microprocessor 4. Thus, via its second input 25, each microprocessor 4 receives not only information indicating when a priority pulse 40 exists in the ultrasonic proximity switch 1 in question, but via the shared line 31, also receives the feedback signal by way of the priority pulses 40 from the adjacent ultrasonic proximity switches 1. In this manner, through its microprocessor 4, each ultrasonic proximity switch 1 is able to notice at what point after the starting point 38 its priority pulse 40 was emitted. As a result, at the end of the timing window 39, the proximity switch with the first emitted priority pulse 40 runs through a measuring cycle and emits an initial pulse 41, while all remaining proximity switches release their initial pulse 41, one after another, only when it is their turn in accordance with the self-determined sequence. Serial synchronization carried out in this manner has the considerable advantage of extremely short delay times, since the operation of the ultrasonic proximity switches is not interrupted, but rather only the transmission of the initial pulses is blocked. As a result, there are no unnecessary reset times which would cause additional time delays. The described circuit design, which is not only suited for parallel synchronization operation, but also for serial synchronization, is particularly advantageous for compact units, for cases in which an external control system is not generally used and a cost-effective device configuration is strived for. These types of compact units are usually only equipped with one four-pole plug-in connection, so that only one output is available for synchronization purposes. However, the described configuration also permits operation with an external control system which can be connected up to the shared line 31, to enable operation with a defined parallel synchronization or serial synchronization to be controlled externally through this line.

What is claimed is:

1. A system for loading operating parameters into a microprocessor of a prefabricated proximity switch, comprising:

an overcurrent detection device including said microprocessor;

a programming device which simulates an overcurrent condition across a switching output of the proximity switch by generating a pulse corresponding to the simulated overcurrent condition, wherein the generated pulse represents information about at least one of said operating parameters in a bit pattern form and wherein the generated pulse is received by said overcurrent detection device;

an enabling input of said proximity switch which receives synchronizing pulses;

a synchronizing device synchronizing said microprocessor in response to said synchronizing pulses received by said enabling input of said proximity switch; and an input of said microprocessor which receives said pulse generated by said programming device and received by said overcurrent detection device in response to said synchronizing pulses received by said synchronizing device from said enabling input of the proximity switch to load the bit pattern form information about at least one of the operating parameters into the microprocessor.

2. The system according to claim 1, wherein the programming device simulates the overcurrent condition by switching a connection between two connecting terminals of a load of the proximity switch to a low resistance in response to a desired bit pattern.

3. The system according to claim 2, wherein the low resistance is a short circuit.

4. The system according to claim 1, wherein said overcurrent detection device further comprises:

a current-sensing resistor which produces a voltage drop due to an excess current; and a transistor triggered by said current-sensing resistor, wherein said transistor switches through a potential of a voltage source as a pulse to the input of the microprocessor.

5. The system according to claim 1, wherein the proximity switch is a three-wire compact switch with a four-pole plug-in connection.

6. The system according to claim 1, further comprising a memory which stores the operating parameters.

7. The system according to claim 1, wherein the proximity switch is designed as an ultrasonic proximity switch.

8. The system according to claim 1, wherein the synchronizing device is wired between the enabling input and the microprocessor.

9. The system according to claim 8, wherein said synchronizing device performs at least one of parallel and serial synchronization.

10. A system for loading operating parameters into a microprocessor of each of a plurality of prefabricated proximity switches, comprising for each proximity switch:

an overcurrent detection device including said microprocessor of said proximity switch;

a programming device which simulates an overcurrent condition across a switching output of said proximity switch by generating a pulse corresponding to the simulated overcurrent condition, wherein the generated pulse represents information about at least one of said operating parameters in a bit pattern form and wherein the generated pulse is received by said overcurrent detection device;

an enabling input of said proximity switch which receives synchronizing pulses;

a synchronizing device synchronizing said microprocessor in response to said synchronizing pulses received by said enabling input of said proximity switch; and an input of said microprocessor which receives said pulse generated by said programming device and received by said overcurrent detection device in response to said synchronizing pulses received by said synchronizing device from said enabling input of the proximity switch to load the bit pattern form information about at least one of the operating parameters into the microprocessor.

11. The system according to claim 10, wherein the enabling inputs of said plurality of proximity switches are electrically connected.

12. The system according to claim 11, wherein said synchronizing device for each proximity switch indicates that each of said proximity switches is ready to transmit.

13. The system according to claim 11, wherein said synchronizing device for each proximity switch indicates a time that only that proximity switch is ready to transmit.

14. A method for loading operating parameters into a microprocessor of a prefabricated proximity switch, the proximity switch including an enabling input, said method comprising steps of:

simulating an overcurrent condition across a switching output of the proximity switch by generating a pulse corresponding to the simulated overcurrent condition, wherein the generated pulse represents information about at least one of said operating parameters in a desired bit pattern form;

providing first synchronizing pulses to the enabling input of the proximity switch;

synchronizing said microprocessor in response to said first synchronizing pulses provided to the enabling input of the proximity switch; and providing the generated pulse to the microprocessor in response to the first synchronizing pulses provided to the enabling input of the proximity switch to load the bit pattern form information about at least one of the operating parameters into the microprocessor.

15. The method according to claim 14, wherein said simulating step simulates the overcurrent condition by switching a connection between two connecting terminals of a load of the proximity switch to a low resistance in response to a desired bit pattern.

16. The method according to claim 14, wherein the first synchronizing pulse provided to the enabling input includes an initial synchronizing duration with a low voltage level, which is followed by a first delay with a high voltage level, which is followed by a programming enable time with a low voltage level, which is followed by a second delay and a subsequent duration for data bit acceptance with a high voltage level, followed by a duration for acknowledging a first data bit at a low voltage level, and for further data bits, additional cycles follow, made up of a second delay, a data bit acceptance duration, and a data-bit acknowledgment duration whereby a data-bit enabling time is started following the second delay, at the end of which the enabling condition for data-bit transfer is provided.

17. A method for loading operating parameters into a microprocessor of each of a plurality of prefabricated proximity switches, each proximity switch including an enabling input, said method comprising for each of the proximity switches steps of:

simulating an overcurrent condition across a switching output of the proximity switch by generating a pulse corresponding to the simulated overcurrent condition, wherein the generated pulse represents information about at least one of said operating parameters in a bit pattern form;

providing first synchronizing pulses to the enabling input of the proximity switch;

synchronizing the microprocessor of the proximity switch in response to said first synchronizing pulses provided to the enabling input of the proximity switch; and providing the generated pulse to the microprocessor in response to the first synchronizing pulses provided to the enabling input of the proximity switch to load the bit pattern form information about at least one of the operating parameters into the microprocessor.

18. The method according to claim 17, further comprising a step of performing parallel synchronization of the microprocessor for each of the proximity switches.

19. The method according to claim 17, further comprising a step of performing serial synchronization of the microprocessor for each of the proximity switches.

20. The method according to claim 17, wherein said simulating step for each proximity switch simulates the overcurrent condition by switching a connection between two connecting terminals of a load of the proximity switch to a low resistance in response to a desired bit pattern.

21. The method according to claim 17, wherein the first synchronizing pulse provided to the enabling input includes an initial synchronizing duration with a low voltage level, which is followed by a first delay with a high voltage level, which is followed by a programming enable time with a low voltage level, which is followed by a second delay and a subsequent duration for data bit acceptance with a high voltage level, followed by a duration acknowledging a first data bit at a low voltage level, and for further data bits, additional cycles follow, made up of a second delay, a data bit acceptance duration, and a data-bit acknowledgment duration whereby a data-bit enabling time is started following the second delay, at the end of which the enabling condition for data-bit transfer is provided.

* * * * *